United States Patent [19]

Kruger

[11] Patent Number: 4,764,050
[45] Date of Patent: Aug. 16, 1988

[54] DEVICE FOR FASTENING PARTS ON BODYWALLS OF MOTOR VEHICLES

[75] Inventor: Ersin Kruger, Cologne, Fed. Rep. of Germany

[73] Assignee: Ford Motor Company, Dearborn, Mich.

[21] Appl. No.: 37,474

[22] Filed: Apr. 13, 1987

[30] Foreign Application Priority Data

May 20, 1986 [DE] Fed. Rep. of Germany ....... 3613329

[51] Int. Cl.4 .......................... B25G 3/18; F16B 21/00
[52] U.S. Cl. ..................................... 403/322; 403/327; 403/330
[58] Field of Search ................ 403/330, 327, 325, 322

[56] References Cited

U.S. PATENT DOCUMENTS 4,504,167 3/1985 Nakanishi ............................ 403/325
4,568,123 2/1986 Yasui et al. ..................... 403/325 X

FOREIGN PATENT DOCUMENTS 0063294 4/1982 European Pat. Off. .
2933385 3/1981 Fed. Rep. of Germany .

Primary Examiner—Andrew V. Kundrat
Attorney, Agent, or Firm—Daniel M. Stock; Clifford L. Sadler

[57] ABSTRACT

A device is described for mounting an object on a wall, such as a motor vehicle body panel, having at least two bolts projecting from its surface, each bolt being formed with a neck portion and a larger diameter head portion.

The mounting device comprises a mounting plate and a locking element pivotable about the mounting plate, the locking element having keyhole slots for receiving the heads of the bolts which project from the body panel. The mounting plate has resilient tongues for engaging the heads of the bolts passing through the keyhole slots, which cooperate with detents projecting from the locking element to prevent rotation of the locking element relative to the mounting plate until all the resilient tongues have been engaged by respective bolts projecting through respective keyhole slots in the locking element.

2 Claims, 2 Drawing Sheets

DEVICE FOR FASTENING PARTS ON BODYWALLS OF MOTOR VEHICLES

BACKGROUND OF THE INVENTION

1. Field of Invention

The invention relates to a device for mounting an object on a wall, such as a motor vehicle body panel, having at least two bolts projecting therefrom, each bolt being formed with a neck portion and a larger diameter head portion (and herein referred to as stop bolts).

2. Description of the Prior Art

A device is known from European Patent No. 00 63 294, in which bolts projecting from a wall having a plurality of parallel grooves and cooperate with a spring-loaded locking element partially engaging over a receiving slot. The locking element is forced back by a conically formed head portion of the stop bolts when placed on the receiving slots and can then drop into the grooves on the step bolts.

This known device has the disadvantage that when the step bolts are disposed further apart the spring-loaded locking element can also drop in when only one stop bolt is introduced into the receiving slot in the mounting plate. A defective mounting of the object can therefore occur.

A further device for mounting an object on a bodywork wall is known from DE-OS No. 29 33 385, in which step bolts cooperate with only one neck portion and a flat head portion in conjunction with keyhole slots on a mounting plate, a separate spring-loaded locking element being disposed adjacent each neck portion of a keyhole slot.

This known device suffers from the same disadvantage that the locking element can engage even if only one step bolt is inserted into only one keyhole slot.

SUMMARY OF THE INVENTION

The present invention seeks to provide a device for mounting an object on a wall having at least two step bolts to be received in slots formed in the device in which it is ensured that a spring-loaded locking element can only be engaged when all the receiving slots are placed on and pressed onto the corresponding step bolts.

According to the present invention, there is provided a device for mounting an object on a motor vehicle body panel having at least two bolts projecting therefrom. Each bolt is formed with a neck portion and a larger diameter head portion, and the mounting device comprises a mounting plate and a locking element pivotable about the mounting plate. The locking element has keyhole slots for receiving the heads of the bolts projecting from the body panel, and the mounting plate has resilient tongues for engaging the heads of the bolts passing through the keyhole slots. The tongues cooperate with detents projecting from the locking element to prevent rotation of the locking element relative to the mounting plate until all the resilient tongues have been engaged by bolts projecting through respective keyhole slots in the locking element.

In the present invention, the tongues on the mounting plate must all be raised clear of the associated detents on the locking element before the locking element can turn and in this way engagememt can only take place after all the bolts have been received in their respective keyhole slots. This error-free assembly is particularly important when the device is being fitted in an awkward position having only limited access.

It is preferred that the locking element should be spring-biased so as to engage the bolts automatically as soon as the bolts have entered their slots.

Resilient arms for receiving the object to be mounted, for example the switch box of an electronic anti-locking system, can be disposed on the mounting plate which is secured to the bodywork wall.

BRIEF DESCRIPTION OF THE DRAWINGS

The invention will now be described further, by way of example, with reference to the accompanying drawings, in which.

DESCRIPTION OF A PREFERRED EMBODIMENT

Figure 1:
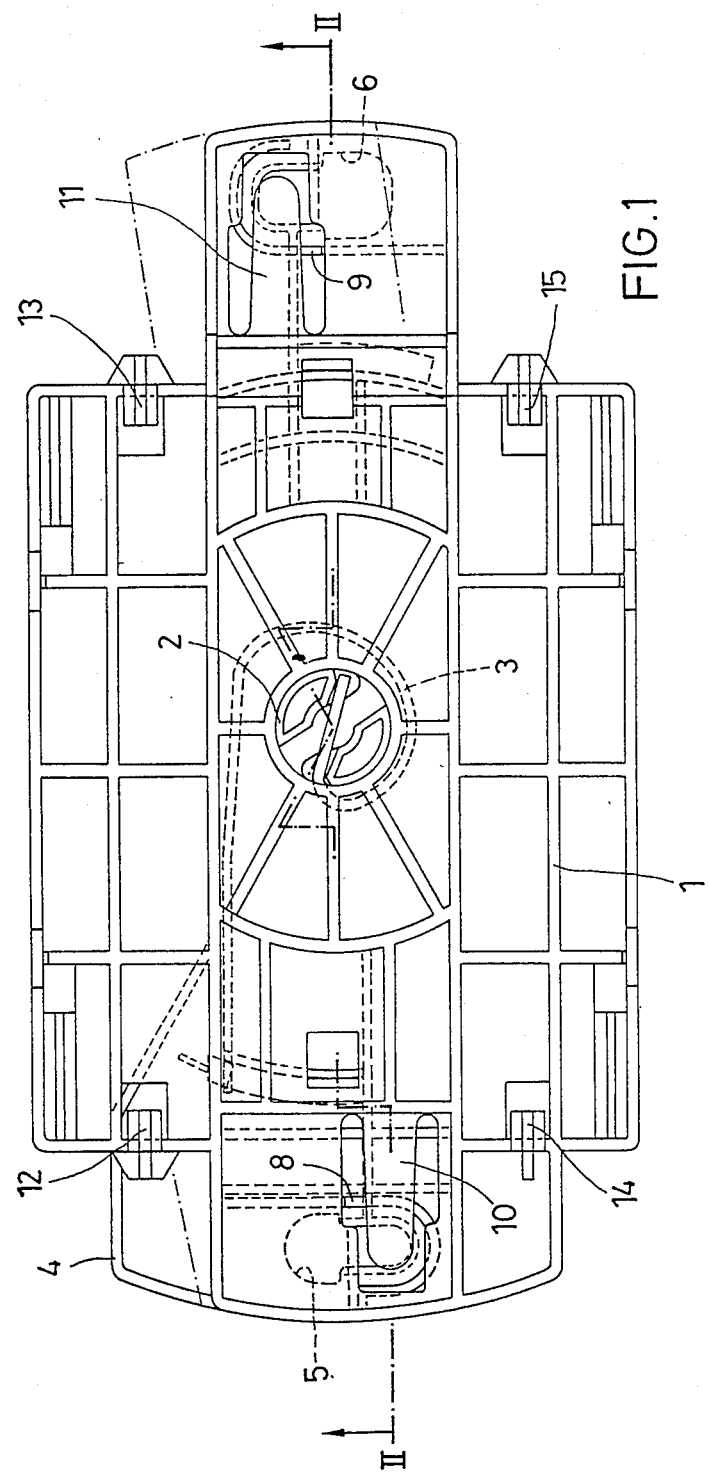
FIG. 1 is a plan view of a mounting device of the invention.
Figure 2:
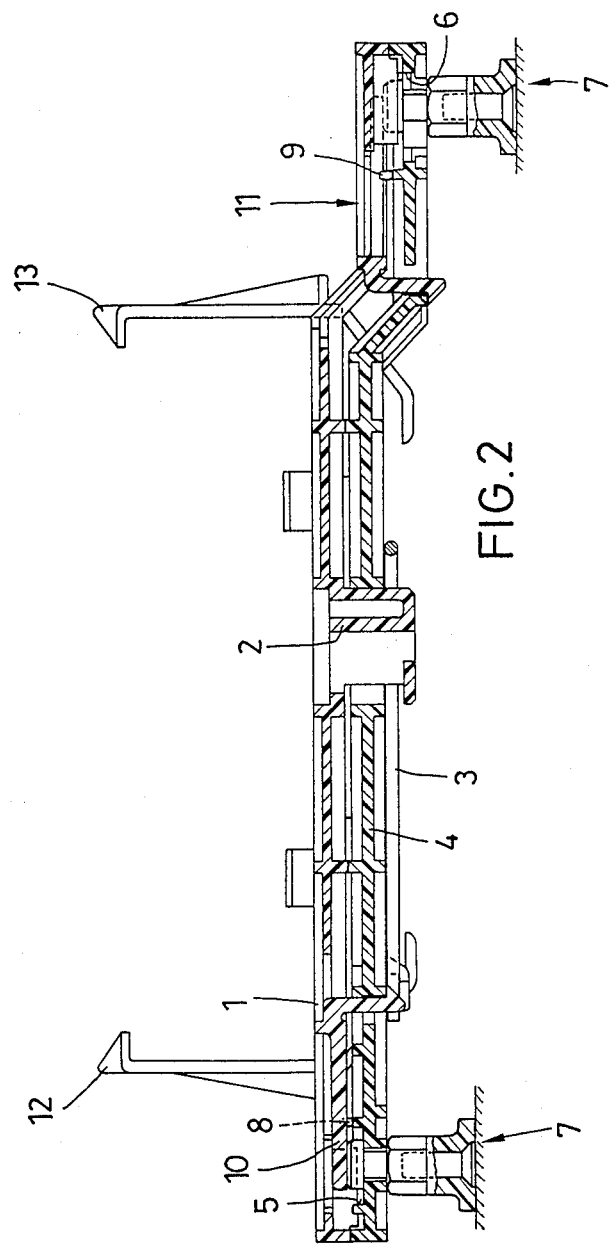
FIG. 2 is a section along the line II—II in FIG. 1.

The mounting device of the present invention is illustrated as comprising a mounting plate 1 and a locking element 4 which is pivotable relative to the mounting plate 1 about a central boss 2 and is biased by means of a spring 3. The mounting plate may be formed, for example, as an injection molded part of plastic material.

Keyhole slots 5 and 6 are formed in the locking element 4 for receiving stop bolts 7, the latter being constructed as T-bolts or set bolts. Each keyhole slot 5 or 6 has a large diameter portion for passage of the head of one of the step bolts 7 and a narrower neck portion corresponding approximately to the neck of the stop bolt.

Prior to assembly, the locking element 4 is pivoted with respect to the mounting plate 1 against the force of the spring 3 and is held in this position by means of detents 8 and 9 on the locking element 4 which cooperate with resilient tongues 10 and 11 on the mounting plate 1.

In this relative position of the mounting plate 1 and the locking element 4, the resilient tongues 10 and 11 of the mounting plate 1 engage over the head portions of the keyhole slots 5 and 6 in the locking element 4. When the heads of the bolts 7 are introduced into the keyhole slots 5 and 6 during the mounting of the device on a body panel, the resilient tongues 10 and 11 are deflected clear of the detents 8 and 9 permitting rotation of the locking element 4 relative to the mounting plate 1. When all the detents have been cleared, the spring 3 turns the locking element 4 and causes engagement of the bolts 7 in the slots 5 and 6.

Four resilient clips 12, 13, 14 and 15 are formed on the mounting plate 1 by means of which the object to be mounted, for example the switch box of an electronic anti-locking system can be received on the mounting plate. Of course, other components, such as headlamps, rear lights and the like, can be similarly mounted.

What is claimed is:

1. A device for mounting an object on a motor vehicle body panel having at least two bolts projecting therefrom each bolt being formed with a neck portion and a larger diameter head portion, the mounting device comprising a mounting plate, a locking element pivotable about the mounting plate, the locking element having keyhole slots for receiving the heads of the bolts projecting from the body panel and the mounting plate having resilient tongues for engaging the heads of the bolts passing through the keyhole slots, the tongues cooperating with detents projecting from the locking element to prevent rotation of the locking element relative to the mounting plate until all the resilient tongues have been engaged by respective bolts projecting through respective keyhole slots in the locking element.

2. A device as claimed in claim 1, wherein the locking element is spring biased relative to the mounting plate.

* * * * *